(12) United States Patent
Gutmann et al.

(10) Patent No.: US 9,373,717 B2
(45) Date of Patent: *Jun. 21, 2016

(54) STRESS-INDUCING STRUCTURES, METHODS, AND MATERIALS

(71) Applicant: Infineon Technologies AG, Neubiberg (DE)

(72) Inventors: Alois Gutmann, Poughkeepsie, NY (US); Roland Hampp, Bad Abbach (DE); Scott Jansen, Boulder, CO (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/565,243

(22) Filed: Dec. 9, 2014

(65) Prior Publication Data

US 2015/0137253 A1    May 21, 2015

Related U.S. Application Data

(60) Continuation of application No. 13/750,919, filed on Jan. 25, 2013, now Pat. No. 8,907,444, which is a division of application No. 12/122,849, filed on May 19, 2008, now Pat. No. 8,361,879.

(51) Int. Cl.
| | |
|---|---|
| *H01L 21/762* | (2006.01) |
| *H01L 29/78* | (2006.01) |
| *H01L 29/06* | (2006.01) |
| *H01L 29/12* | (2006.01) |

(52) U.S. Cl.
CPC ...... *H01L 29/7846* (2013.01); *H01L 21/76232* (2013.01); *H01L 29/06* (2013.01); *H01L 29/0653* (2013.01); *H01L 29/12* (2013.01); *H01L 29/78* (2013.01); *H01L 29/7848* (2013.01)

(58) Field of Classification Search
CPC .................. H01L 29/7848; H01L 29/7846
See application file for complete search history.

(56) References Cited

U.S. PATENT DOCUMENTS

| | | | |
|---|---|---|---|
| 6,657,276 B1 * | 12/2003 | Karlsson | ............ H01L 21/7624 257/506 |
| 6,828,211 B2 | 12/2004 | Chi | |
| 7,227,205 B2 | 6/2007 | Bryant et al. | |
| 7,396,728 B2 | 7/2008 | Varghese et al. | |
| 7,504,704 B2 | 3/2009 | Currie et al. | |
| 7,560,781 B2 | 7/2009 | Gotoh et al. | |
| 7,670,895 B2 | 3/2010 | Van Gompel et al. | |
| 7,701,016 B2 | 4/2010 | Kishii et al. | |
| 7,833,861 B2 | 11/2010 | Choi | |
| 8,907,444 B2 * | 12/2014 | Gutmann | .......... H01L 21/76232 257/510 |
| 2006/0087000 A1 | 4/2006 | Okuno | |

(Continued)

OTHER PUBLICATIONS

Carneiro et al., Real Time Scale Measurement of Residual Stress Evolution During Coating Deposition Using Electrical Extensometry ₰ Rev. Adv. Mater. Sci., 2004, pp. 32-40, vol. 7, No. 1, Advanced Study Center Co. Ltd., St. Petersburg, Russia.

(Continued)

*Primary Examiner* — John C Ingham
(74) *Attorney, Agent, or Firm* — Slater Matsil, LLP

(57) ABSTRACT

Stress-inducing structures, methods, and materials are disclosed. In one embodiment, an isolation region includes an insulating material in a lower portion of a trench formed in a workpiece and a stress-inducing material disposed in a top portion of the trench over the insulating material.

20 Claims, 5 Drawing Sheets

(56) References Cited

U.S. PATENT DOCUMENTS

| | | |
|---|---|---|
| 2006/0220142 A1 | 10/2006 | Tamura |
| 2007/0161206 A1 | 7/2007 | Ko et al. |
| 2007/0228486 A1 | 10/2007 | Tsuchiya et al. |

OTHER PUBLICATIONS

Cordova-Martinez et al., "Nanocrystalline Tetragonal Zirconium Oxide Stabilization at Low Temperatures by Using Rare Earth Ions: Sm3+ and Tb3+," Optical Materials, 2002, pp. 263-271, vol. 20, Issue 4, Elsevier Science B.V., Amsterdam, The Netherlands.

Pastor et al., "High-Temperature Tensile Strength of Er2O3-Doped ZrO2 Single Crystals," Journal of the American Ceramic Society, Jul. 2006, pp. 2140-2146, vol. 89, No. 7, The American Ceramic Society, Westerville, OH.

Shelekhina et al., "Stabilization of Zirconium Oxide in Aluminum Oxide—Zirconium Oxide System by Complex Stabilizers," Journal of Engineering Physics and Thermophysics, Nov. 1995, pp. 741-743, vol. 68, No. 6, Plenum Publishing Corp., New York, NY.

\* cited by examiner

STRESS-INDUCING STRUCTURES, METHODS, AND MATERIALS

This application is a continuation of application Ser. No. 13/750,919 filed on Jan. 25, 2013, which is a divisional application of U.S. application Ser. No. 12/122,849, entitled "Stress-Inducing Structures, Methods, and Materials," filed on May 19, 2008 and issued as U.S. Pat. No. 8,361,879 on Jan. 29, 2013 and are both incorporated herein by reference.

TECHNICAL FIELD

The present invention relates generally to the fabrication of semiconductor devices, and more particularly to stress-inducing structures, methods, and materials for semiconductor devices.

BACKGROUND

Semiconductor devices are manufactured by depositing many different types of material layers over a semiconductor substrate or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip, for example.

Isolation regions are often used to provide electrical isolation between active regions or electronic components formed on an integrated circuit. Shallow trench isolation (STI) and deep trench (DT) isolation are some types of isolation regions that are widely used in semiconductor devices to separate devices such as transistors, although other types of isolation regions are also used in semiconductor devices.

In some designs, introducing stress to regions of a semiconductor device is desired, to improve device performance. For example, introducing stress to a channel region of a transistor may be desirable in some applications, to increase carrier mobility.

Improved methods of forming isolation regions and stress-inducing structures, methods, and materials for semiconductor devices are needed in the art.

SUMMARY OF THE INVENTION

Embodiments of the present invention achieve technical advantages by providing novel stress-inducing structures, methods, and materials for semiconductor devices.

In accordance with one embodiment of the present invention, an isolation structure includes a trench disposed in a workpiece, and an insulating material disposed in a lower portion of the trench. A stress-inducing material is disposed in an upper portion of the trench over the insulating material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely, in the formation of STI regions of semiconductor devices. The invention may also be applied, however, to other isolation regions of semiconductor devices, such as deep trench (DT) isolation regions, isolation regions comprising STI regions combined with DT isolation regions, or other types of isolation regions, as examples. Embodiments of the present invention also include novel stress-inducing materials for semiconductor devices.

Embodiments of the present invention achieve technical advantages by providing novel isolation structures that improve stress performance of adjacent devices. Multiple step process flows are described herein for forming isolation regions that apply tensile or compressive stress directly on a workpiece adjacent or proximate the isolation regions.

Figure 1:
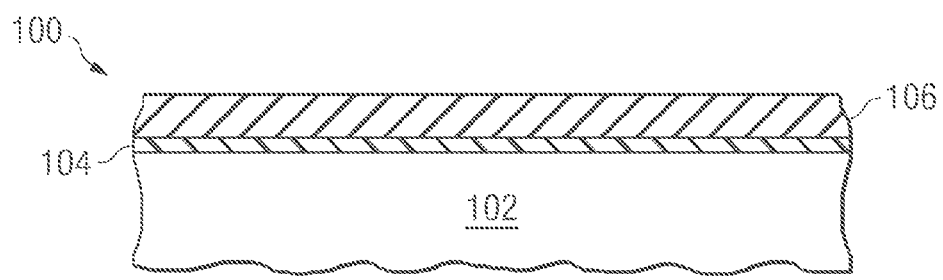
FIGS. 1 through 9 show cross-sectional views of a method of fabricating isolation regions of a semiconductor device in accordance with an embodiment of the present invention, wherein a stress-inducing material is formed in an upper portion of the isolation regions, creating stress in channel regions of transistors proximate the isolation regions.

FIGS. 1 through 9 show cross-sectional views of a method of fabricating isolation regions of a semiconductor device 100 in accordance with an embodiment of the present invention. Referring first to FIG. 1, a workpiece 102 is provided. The workpiece 102 may include a semiconductor substrate, body, or wafer comprising silicon or other semiconductor materials, for example. The workpiece 102 may also include other active components or circuits, not shown. The workpiece 102 may comprise silicon oxide disposed over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or germanium-on-insulator (GOI) substrate, for example.

A pad oxide 104 is formed over the workpiece 102. The pad oxide 104 may comprise about 50 nm of silicon dioxide. The pad oxide 104 may be formed by thermal oxidation or a deposition process, for example. A pad nitride 106 is formed or deposited over the pad oxide 104. The pad nitride 106 may comprise about 200 nm of silicon nitride, for example. Alternatively, the pad oxide 104 and the pad nitride 106 may comprise other materials and dimensions.

Figure 2:
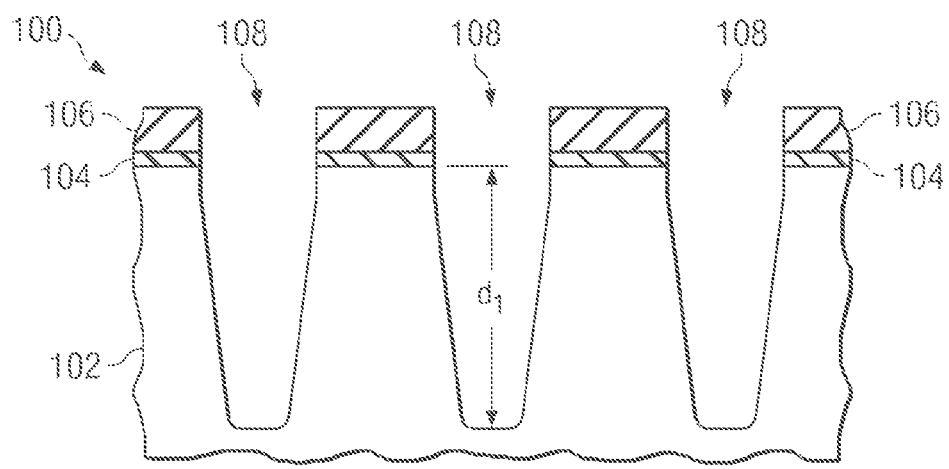

A plurality of trenches 108 are formed or patterned in the pad nitride 106, the pad oxide 104, and the workpiece 102 using a lithography process, as shown in FIG. 2. For example, a layer of photosensitive material such as a photoresist (not shown) may be deposited over the pad nitride 106, and the layer of photoresist may be patterned with a desired pattern for the trenches 108. The layer of photoresist may be patterned by exposure to energy through a lithography mask, for example, also not shown. Alternatively, a reflective lithography mask or direct patterning may also be used to pattern the layer of photoresist. The layer of photoresist is then used as an etch mask while portions of the pad nitride 106, pad oxide 104, and workpiece 102 are etched away or removed to form the trenches 108 using an etch process such as a reactive ion etch (RIE) process, as an example. Alternatively, other etch processes may also be used to form the trenches 108. An optional hard mask (also not shown) may be formed over the pad nitride 106 before the layer of photoresist is deposited, and the hard mask, or the hard mask layer of photoresist, may be used as an etch mask during the patterning of the pad nitride 106, pad oxide 104, and workpiece 102, for example.

The trenches 108 may comprise a depth or dimension $d_1$ from a top surface of the workpiece 102 of about 500 nm or less, as an example. In some embodiments, the trenches 108 may comprise a depth of about 200 nm, for example. The trenches 108 may comprise a width of about 100 nm or less, and may comprise a width of about 70 nm in some embodiments, as examples. Alternatively, the trenches 108 may comprise other dimensions, e.g., about 100 nm or greater. Three trenches 108 are shown in the figures of the present patent application; however, there may be a plurality, e.g., dozens, hundreds, or thousands, of trenches 108 formed across the surface of the workpiece 102, not shown. The trenches 108 may comprise substantially vertical sidewalls (not shown), or the trench 108 sidewalls may taper inwardly towards the bottom of the trench, as shown in FIG. 2.

The trenches 108 may be formed between active areas of the semiconductor device 100. The trenches 108 may be formed between portions of transistors, between two adjacent transistors, or near or proximate regions that transistors will be formed in, for example. In some embodiments, the trenches 108 are formed adjacent channel regions of transistors, to be described further herein. The trenches 108 may also be formed proximate other active areas or devices of a semiconductor device 100.

Figure 10:
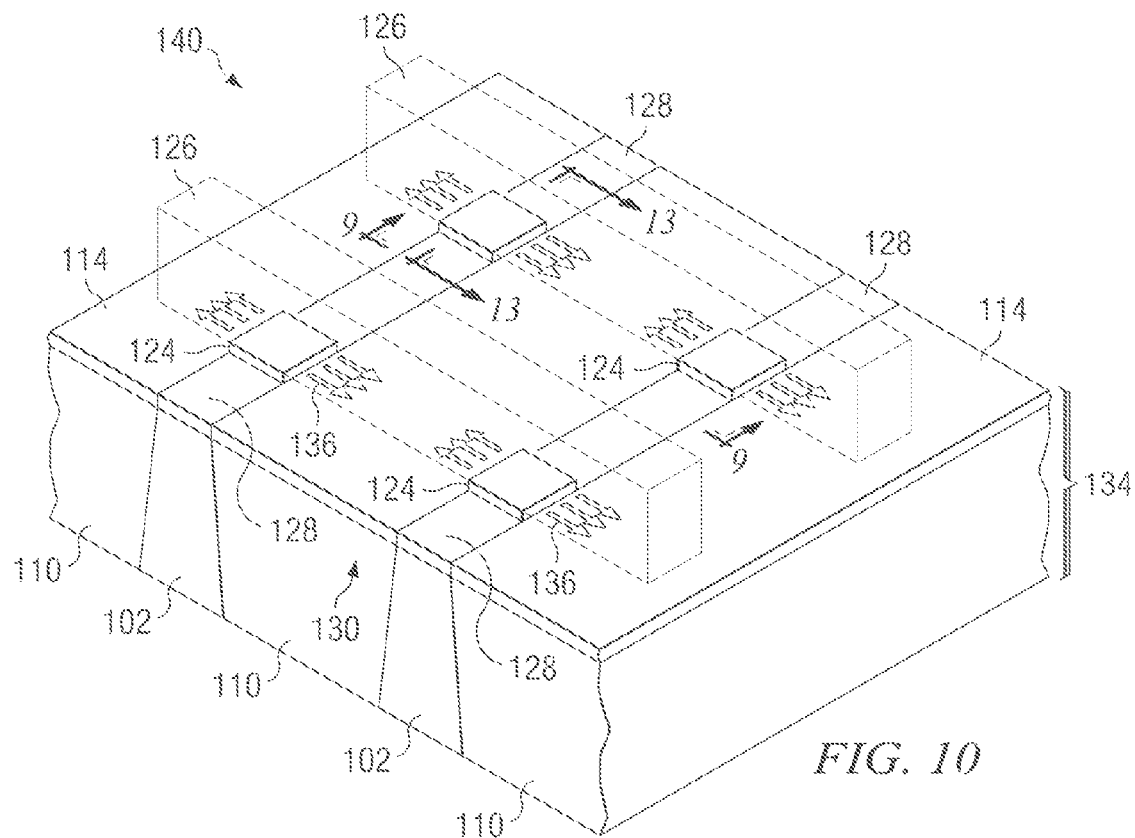
FIG. 10 shows a perspective view of the semiconductor device shown in FIG. 9.

The trenches 108 may be substantially rectangular in a top view, e.g., extending in and out of the paper by several nm or μm in some embodiments, for example (see the perspective view of FIG. 10). Alternatively, the trenches 108 may be oval, round, meandering shapes, or other shapes, for example.

Figure 3:
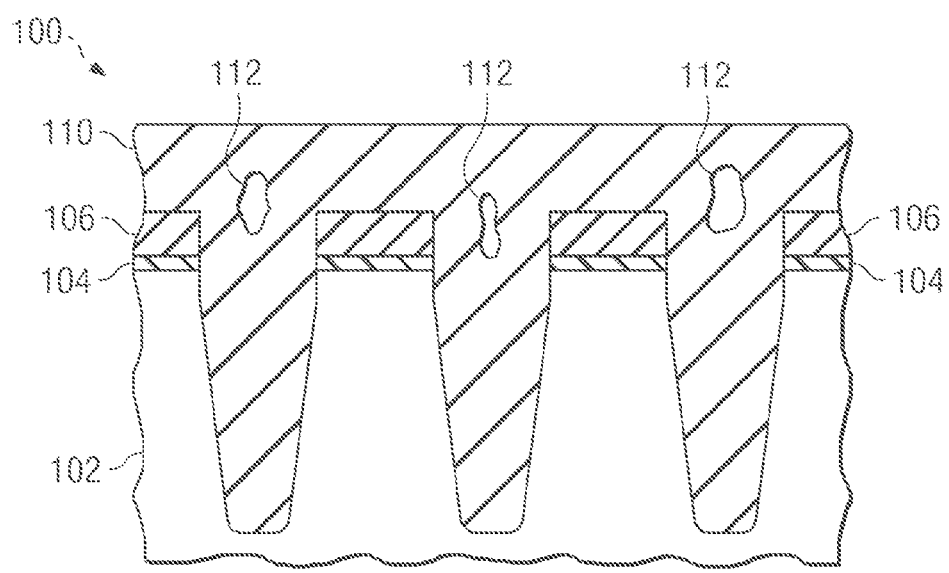

A first insulating material 110 is deposited over the workpiece 102, at least partially filling or completely filling the trenches 108, as shown in FIG. 3. The first insulating material 110 comprises an oxide material in some embodiments and may be deposited using a chemical vapor deposition (CVD) process or other type of deposition process, for example. The first insulating material 110 may comprise silicon dioxide and/or a tetra ethyl oxysilane (TEOS)-based oxide, as examples. The first insulating material 110 may be deposited using a high aspect ratio process such as a HARP™ oxide by Applied materials, as an example. The first insulating material 110 may alternatively comprise Flowfill™ by Aviza, as another example. The first insulating material 110 may comprise a high density plasma (HDP) oxide, as yet another example. Alternatively, the first insulating material 110 may comprise other materials and may be deposited using other methods.

The first insulating material 110 may optionally be annealed after the deposition process, e.g., if the first insulating material 110 comprises Flowfill or HARP. As one example, the optional anneal process after forming the first insulating material 110 may comprise a temperature of about 500 degrees C. for several minutes, although alternatively, other temperatures and time periods may also be used for the optional post-deposition anneal process.

Before the first insulating material 110 is deposited, a liner (not shown) may be formed on the surface of the workpiece 102. The first insulating material 110 may include the liner, for example. The liner may comprise an insulating material such as an oxide or a nitride material having a thickness of about 4 to 8 nm, as an example. Alternatively, the optional liner may comprise other materials and dimensions. The liner may cover the sidewalls and bottom surface of the trenches 108 and the top surface of the workpiece 102, for example.

The optional liner may prevent boron segregation from the active regions into the first insulating material 110, for example. Semiconductor active regions are typically doped with boron because of the acceptor levels that boron provides. However, boron has a higher affinity to dielectric materials, such as silicon dioxide, and boron may tend to migrate or segregate into the first insulating material 110. The liner may also increase the consistency of threshold voltages for each device in the device group created in the same workpiece 102, for example. The leakage or segregation of boron into the first insulating layer 110 may tend to cause a shift in the threshold voltage among the multiple devices produced in the same substrate or workpiece 102 for the device group. Therefore, resulting device groups may tend to have devices with different threshold voltages disposed proximate or adjacent to each other. This difference in threshold voltage may lead to damage or unexpected operating results, both of which detract from the value and desirability of the semiconductor device 100 group. The inclusion of the liner in the trenches 108 may prevent boron segregation which thus helps in maintaining the consistency of the threshold voltage. The liner may also relax surface conditions at the trench 108 sidewalls which may have been degraded during the RIE process to form the trenches 108, for example. In some embodiments, the liner may be omitted, for example.

The optional liner of the first insulating material 110 may comprise SiON, $SiO_2$, SiN, or combinations or multiple layers thereof, for example. The liner may be formed using a Rapid Thermal Oxidation (RTO) process at a temperature of about 750° C. to 1,000° C. followed by a $NH_3$ bake process at a temperature of about 1,050° C., as one example. Alternatively, the liner may be formed using a Rapid Thermal Processing (RTP) nitride deposition process, using $NH_3$ at a temperature of about 650° C. to 1,000° C., followed by an $RTN_2O$ re-oxidation process comprising an RTO with $N_2O$ at a temperature of about 900° C. and 1,150° C., as another example. In another embodiment, the liner may be formed using an In-Situ Steam Generated (ISSG) oxide process at a temperature of about 700° C. to 900° C. The ISSG oxide process may comprise a low-pressure process at about 20 Torr or below, wherein pre-mixed $H_2$ and $O_2$ are introduced to the process chamber directly, without pre-combustion, for example.

The deposition process of the first insulating material 110 may result in the formation of voids 112 proximate the top portion of the trenches 108, as shown in FIG. 3, e.g., if the first insulating material 110 comprises an HDP oxide or a HARP oxide. The voids 112 may form due to the deposition process, as more material accumulates over the top surface and edges of the pad nitride 106, closing off portions of the first insulating material 110 over the trenches 108, for example. In other embodiments, for example, wherein the first insulating material 110 comprises Flowfill or other materials, voids 112 may not be formed.

Figure 4:
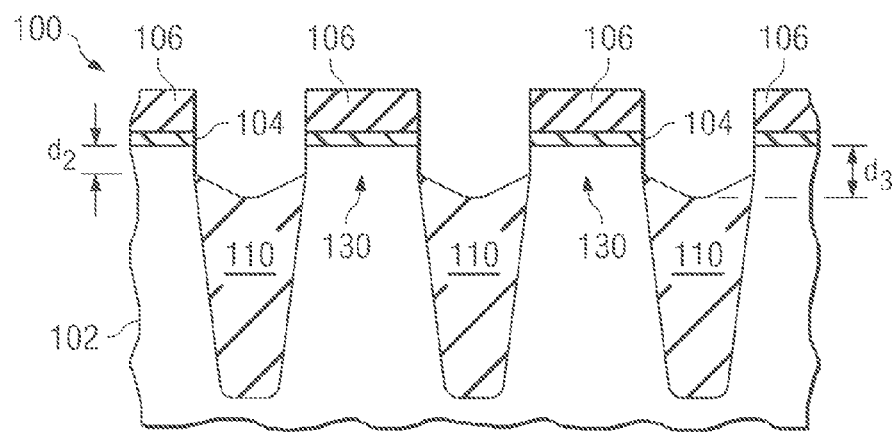

The top portion of the first insulating material 110 is removed using an etch process, as shown in FIG. 4. The top portion of the first insulating material 110 is removed to a predetermined height below the top surface of the workpiece 102, for example. If the first insulating material 110 includes a liner, a top portion of the liner may also be removed, for example. The top portion of the first insulating material 110 is etched back using a dry or wet etch process, exposing the pad nitride 106, the pad oxide 104, and a top portion of the workpiece 102 in the trenches 108, as shown. The etch process may comprise a sputter component in some embodiments, for example. The first insulating material 110 may be recessed by about several nm or more below the top surface of the workpiece 102, for example.

In some embodiments, the etch process results in the recessed first insulating material 110 having a recessed central portion. The recessed first insulating material 110 may comprise a V-shape in a cross-sectional view, as shown, or a U-shape. In these embodiments, the etch process used to recess the first insulating material 110 may comprise a wet etch process, e.g., comprising hydrofluoric (HF) acid, although other etchant materials may also be used. After the etch process, the first insulating material 110 may comprise a depth or dimension $d_2$ of about 50 nm or less proximate sidewalls of the trenches 108 below the top surface of the workpiece 102. The first insulating material 110 may comprise a depth or dimension $d_3$ of about 100 nm or less in the central portion of the trenches 108 below the top surface of the workpiece 102, in some embodiments, for example. Alternatively, the first insulating material 110 may be recessed by other amounts, e.g., greater than about 50 nm proximate the sidewalls of the trenches 108 and greater than about 100 nm in the central portion of the trenches 108 below the top surface of the workpiece 102. As one example, dimension $d_2$ may comprise about 20 nm and dimension $d_3$ may comprise about 50 nm, in some applications.

Figure 11:
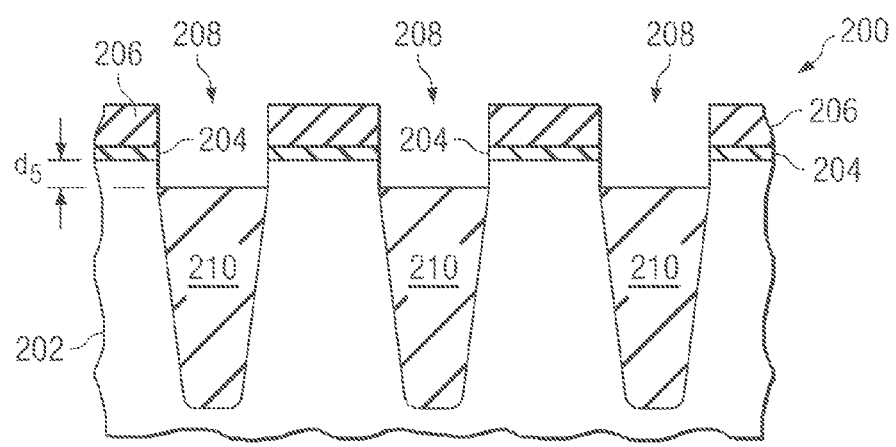
FIGS. 11 and 12 show cross-sectional views of a semiconductor device in accordance with another embodiment of the present invention.
Figure 12:
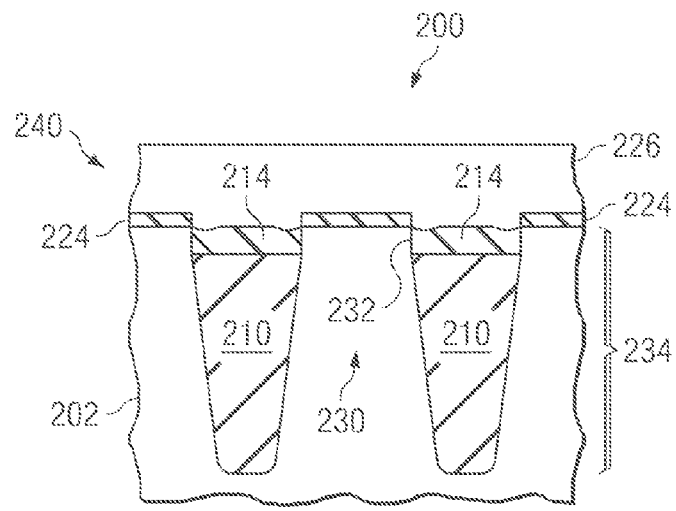

In other embodiments, the etch process may result in the recessed first insulating material 110 having a substantially flat top surface within the trenches 108, as shown in FIGS. 11 and 12, to be described further herein. In these embodiments, the etch process to recess the first insulating material 110 may comprise a dry etch process, e.g., comprising $NF_3$ or other etchant materials.

An optional anneal process may be performed after the etch-back of the first insulating material 110. The optional post etch-back anneal process may comprise a temperature of about 750 to 1,100 degrees C. for about 15 to 40 minutes, for example. As one example, the anneal process may comprise heating the workpiece 102 at about 1,050 degrees C. for about 30 minutes in an $N_2$ ambient, e.g., at flow rate of about 9,000 standard cubic centimeters (s.c.c.m.) of $N_2$ per minute. Alternatively, other temperatures, time periods, and ambient conditions may also be used for the anneal process. The optional anneal process may increase tensile stress of the first insulating material 110, e.g., if the first insulating material 110 is formed using a high aspect ratio process (HARP™), for example. The optional anneal process may improve stress performance of a subsequently deposited stress-inducing material 114 (see FIG. 5), by preventing moisture from entering from the first insulating material 110 into the stress-inducing material 114 (which, if this were to occur, may reduce the stress of the stress-inducing material 114), e.g., if the first insulating material 110 comprises a HARP oxide, as an example.

The workpiece 102 may comprise a channel region 130 of a transistor near a top surface thereof, proximate and/or adjacent the top portion of the trenches 108, as shown.

Figure 5:
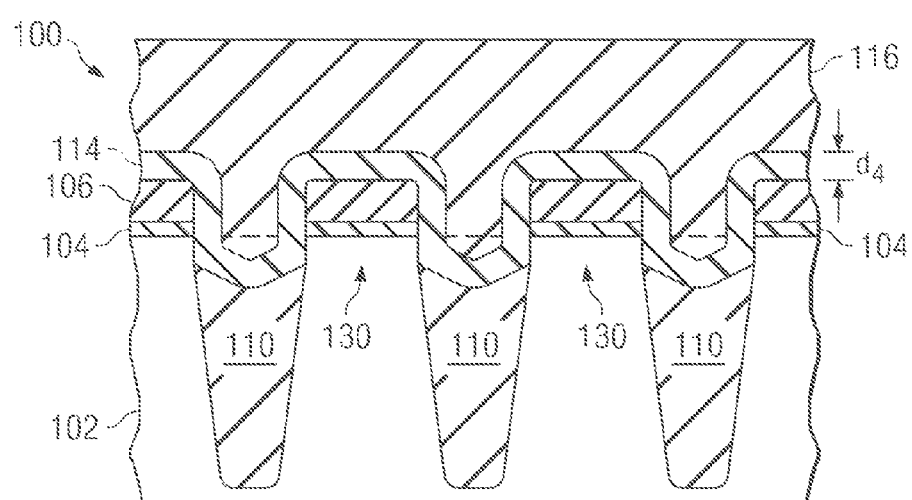

Next, a stress-inducing material 114 is formed over the top surfaces of the pad nitride 106, the sidewalls of the pad nitride 106 and pad oxide 104, the sidewalls of the trenches 108, and the top surface of the first insulating material 110, as shown in FIG. 5. The stress-inducing material 114 comprises a material adapted to induce a stress in the workpiece 102 adjacent the top portion of the trenches 108, e.g., the portion of the workpiece 102 adjacent the stress-inducing material 114. The stress-inducing material 114 may introduce tensile or compressive stress to the workpiece 102, for example, depending on the type of material, deposition conditions, and optional anneal temperatures used to form the stress-inducing material 114.

The stress-inducing material 114 may be substantially conformal as-deposited in some embodiments, as shown in FIG. 5. The thickness or dimension $d_4$ of the stress-inducing material 114 may comprise about 50 nm, although alternatively, dimension $d_4$ may comprise other values, e.g., about 100 nm or less. The thickness or dimension $d_4$ of the stress-inducing material 114 may comprise about 50 nm to 100 nm in some embodiments, for example. The thickness or dimension $d_4$ of the stress-inducing material 114 may vary as a function of the amount of stress desired, the type of material of the stress-inducing material 114, and the depth dimensions $d_2$ or $d_3$ of the recessed first insulating material 110, for example. The top surface of the stress-inducing material 114 may be disposed about +/−50 nm from the top surface of the workpiece 102 in some embodiments, for example.

In other embodiments, the stress-inducing material 114 may be non-conformal as-deposited, as shown in phantom in FIG. 5. The top surface of the stress-inducing material 114 may be substantially coplanar with the top surface of the workpiece 102 or may be disposed above the top surface of the workpiece 102, for example.

The thickness of the stress-inducing material 114 may be dependent upon the width and depth or dimension $d_1$ of the trench 118, for example. The stress-inducing material 114 may comprise a thickness of a few hundred Angstroms to several hundred nm, for example. The thickness of the stress-inducing material 114 is also dependant on the amount of stress that is desired to be induced or caused in the workpiece 102 proximate the stress-inducing material 114, for example. The thicker the stress-inducing material 114, the more the stress will be altered in the workpiece 102, for example.

The stress-inducing material 114 may introduce intrinsic stress to the adjacent workpiece 102 due to differences in average bond lengths in the stress-inducing material 114 in comparison to the average bond lengths of the material of the workpiece 102. The stress-inducing material 114 may also or alternatively introduce non-intrinsic stress to the adjacent workpiece 102 due to differences in the stress coefficient of thermal expansion, e.g., wherein the deposition temperature and/or anneal temperature are selected to create or adjust the amount and/or type of stress. Forming the stress-inducing material 114 may comprise forming a material having a different thermal expansion coefficient than the thermal expansion coefficient of the first insulating material 110, in some embodiments, for example.

In some embodiments, the stress-inducing material 114 may comprise silicon nitride ($Si_3N_4$). Silicon nitride may comprise tensile or compressive stress, depending on the deposition method, for example. A high ion energy deposition process compresses the film and produces a stress-inducing material 114 comprising compressive stress. A low pressure deposition process with a hydrogen content may result in a stress-inducing material 114 comprising tensile stress. Different mixtures of gases and different types and amounts of precursors such as ammonia and silane may be used to achieve the desired amount and type of stress of the stress-inducing material 114, for example.

The stress-inducing material 114 may also comprise zirconium oxide (such as $ZrO_2$ or $Zr_2O_3$), titanium oxide ($TiO_2$), or aluminum oxide ($Al_2O_3$). Exemplary thermal stress contributions for these materials that the stress-inducing material 114 may introduce, formed over a silicon substrate such as workpiece 102, are shown in Table 1, below:

TABLE 1

| Material | Linear thermal expansion coefficient (ppm) | Young's Modulus (E) (in GPa) | Poisson Ratio (v) | Thermal stress over Si after cool-down, from 425 to 25° C. (in GPa) |
|---|---|---|---|---|
| $Si_3N_4$ | 3.0 [at room temperature (RT)] | 210 (PECVD) | 0.24 | 0.14 |
| $Zr_2O_3$ | 10.5 | 160-240 | 0.34 | 0.58 |
| $TiO_2$ | 7.5 (RT) | 283 | 0.27 | 0.62 |
| $Al_2O_3$ | 8 (RT) | 170-400 | 0.21-0.27 | 0.47-1.1 |

The thermal stress introduced by the stress-inducing material 114 may be calculated using Equation 1, $$\sigma = [E/v] * [\alpha_{114} - \alpha_{102}] * T_{dep} - T_{meas};$$

wherein σ is the thermal stress, E is the Young's modulus, v is the Poisson ratio, $\alpha_{114}$ is the thermal expansion coefficient of the stress-inducing material 114, $\alpha_{102}$ is the thermal expansion coefficient of the workpiece 102 or substrate, $T_{dep}$ is the temperature in ° C. at the time of deposition of the stress-inducing material 114, and $T_{meas}$ is the temperature in ° C. at the time of measurement (e.g., which may be room temperature or other temperatures).

The stress-inducing material 114 may be deposited by CVD in some embodiments. In other embodiments, the stress-inducing material 114 may be deposited by plasma enhanced CVD (PECVD), which may introduce compressive stress in some embodiments. The stress-inducing material 114 may comprise $Si_3N_4$ deposited by PECVD to achieve a compressive stress, for example. A high density plasma (HDP) deposition process may be used to form the stress-inducing material 114 in some embodiments. The stress-inducing material 114 may comprise $Si_3N_4$ deposited by an HDP process, to achieve a tensile stress of about 3 GPa, for example. In other embodiments, the stress-inducing material 114 may be deposited using low pressure CVD (LPCVD). The stress-inducing material 114 may be formed by an LPCVD process using Bis-tertiarybutylamino-silane (BT-BAS) as a precursor material, at a temperature of about 600 to 800 degrees C., to form BTBAS-based silicon nitride and achieve a tensile stress of about 1.2 to 2.0 GPa, for example.

The stress-inducing material 114 may be substantially conformal as-deposited; thus, the stress-inducing material 114 may conform to the shape of the underlying first insulating material 110. The stress-inducing material 114 may partially fill the upper part of the trench 108, as shown. Alternatively, the stress-inducing material 114 may be conformal or non-conformal as-deposited, and the thickness may be selected to over-fill the upper part of the trench 108. A subsequent chemical-mechanical polish (CMP) process and/or etch process may be used to remove the stress-inducing material 114 from above the top surface of the workpiece 102.

In embodiments wherein the stress-inducing material 114 left remaining in the upper portion of the trench is thicker in the central regions of the trenches 108 than at the edge regions, a greater amount of stress is introduced to adjacent workpiece 102 regions. The thickness of the stress-inducing material 114 may be selected to achieve the amount of stress desired, for example.

In other embodiments, the stress-inducing material 114 may not be conformal as-deposited, as shown in phantom in FIG. 5, completely or over-filling (e.g., above the top surface of the workpiece 102) the central or upper portion of the trench 108. A CMP process and/or etch-back process may be used to remove excess stress-inducing material 114 from above the top surface of the workpiece 102. The stress-inducing material 114 being thicker in central regions than at edge regions also results in an increased amount of stress being introduced to the adjacent regions of the workpiece 102 in these embodiments, for example.

Thus, a first insulating material 110 that comprises a depression in central regions of the trenches 108 may introduce a greater amount of stress to the workpiece 102 adjacent the isolation regions 134, for example, because a stress-inducing material 114 may be formed that is thicker in central regions than at the edges of the trenches 108.

The workpiece 102 may optionally be annealed after the deposition of the stress-inducing material 114, to alter or increase the stress of the stress-inducing material 114, for example. The workpiece 102 may be annealed at a temperature of about 350 to 475 degrees C. for about 10 to 30 minutes, as an example, although alternatively, other temperatures and time periods may also be used for the anneal process. The optional anneal process may be adjusted according to the needs of the particular stress application, for example. The anneal process may be selected as a function of the particular stack composition of the device 100, e.g., the anneal process may not exceed about 475 degrees C. if a silicide such as NiSi (not shown) is present at the junctions, in some applications. The stress-inducing material 114 may also be treated with ultraviolet (UV) light after the deposition process, for example.

In some embodiments, the stress-inducing material 114 may comprise zirconium oxide (such as $ZrO_2$ or $Zr_2O_3$) and a stress-altering component. The stress-altering component may also function as a stabilizing component in these embodiments, for example. The stress-altering component type and concentration, and the anneal temperature of the stress-inducing material 114, may affect the amount and type of stress of the stress-inducing material 114. The crystalline structure of zirconium oxide varies as a function of the anneal temperature, e.g., as monoclinic, tetragonal, or cubic. The novel stress-altering component may stabilize the zirconium oxide during the anneal process, for example, making the stress-inducing material 114 more stable.

The stress-altering component of the stress-inducing material 114 may comprise $Er_2O_3$, $Y_2O_3$, $Sm_2O_3$, $Tb_2O_3$, or other rare earth element containing materials. For example, the stress-inducing material 114 may comprise $ZrO_2$ or $Zr_2O_3$ doped with $Er_2O_3$. $Er_2O_3$-doped zirconium oxide has an intrinsic stress, and may comprise a tensile stress of about 5 to 10 GPa, as an example.

The stress-altering component of the stress-inducing material 114 may alternatively comprise CaO or MgO. Zirconium oxide stabilized by CaO, MgO, or $Y_2O_3$ comprises a high thermal expansion coefficient of about 13.5 ppm/degree, which provides tensile stress after cooling, for example. If the thermal expansion coefficient of the workpiece 102 is about 2-3 ppm/degree, stress is created because of the differences in the thermal expansion coefficients of the workpiece 102 and the stress-inducing material 114, for example. A stress-inducing material 114 comprising zirconium oxide stabilized by $Y_2O_3$ may be formed using magnetron sputtering in an $Ar/O_2$ atmosphere and may achieve high compressive stress values of about −11 GPa to −5 GPa, as an example.

The stress-altering component may comprise about 5% or less of the composition of the $ZrO_2$ or $Zr_2O_3$ and the stress-altering component of the stress-inducing material 114, for example. In some embodiments, the stress-altering component may comprise about 1 to 2% or of the composition of the $ZrO_2$ or $Zr_2O_3$ and the stress-altering component, for example.

Advantageously, the stress-inducing material 114 may comprise a material that provides a high selectivity in subsequent etch processes. For example, the stress-inducing material 114 may comprise a material that prevents over-etching during a subsequent etch process to form gate contacts, to be described further herein.

A second insulating material 116 is deposited or formed over the stress-inducing material 114, as shown in FIG. 5. The second insulating material 116 may comprise a different material than the first insulating material 110, although alternatively, the second insulating material 116 may comprise the same material as the first insulating material 110. In some embodiments, the second insulating material 116 may comprise HDP oxide or HARP oxide. The second insulating material 116 may comprise a TEOS-based oxide or HDP silicon oxide, for example. Because the lower portions of the trenches 108 are filled with the first insulating material 110 and the stress-inducing material 114, the aspect ratio of the portion (e.g., the upper portion) of the trenches 108 to be filled is lower or reduced, so that a second insulating material 116 may be selected having more options regarding leakage performance behavior, reliability of the insulating material, or performance during a subsequent CMP process to remove a portion of the second insulating material 116 from over the top surface of the workpiece 102, for example.

Figure 6:
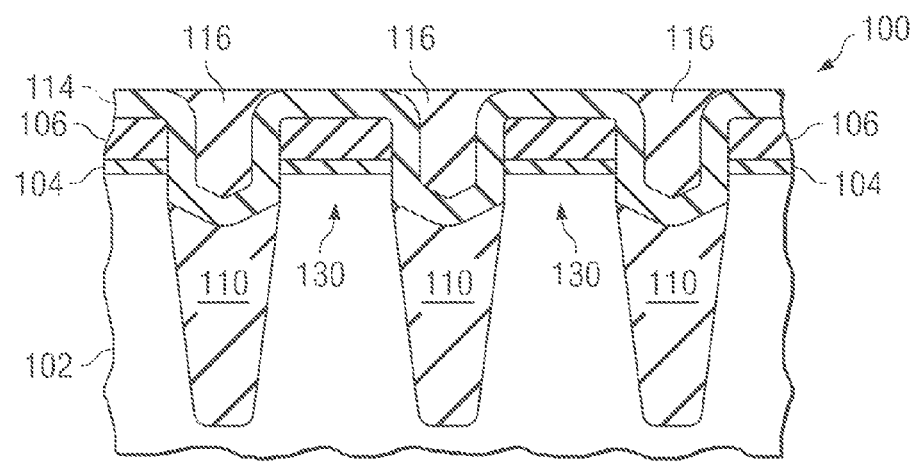

Next, the workpiece 102 is planarized, leaving a portion of the second insulating material 116 remaining over the stress-inducing material 114 within the trenches 108. For example, a top portion of the second insulating material 116 may be removed using a CMP process, as shown in FIG. 6. The CMP process may be adapted to stop on the stress-inducing material 114. The stress-inducing material 114 may function as a CMP stop, for example. The second insulating material 116 may be substantially coplanar with the top surface of the stress-inducing material 114 after the CMP process, as shown.

In some embodiments, the CMP process may be adapted to stop within the stress-inducing material 114 or on the pad oxide 104. The CMP process may comprise a multiple-step procedure, e.g., a two-step procedure, in some embodiments.

Figure 7:
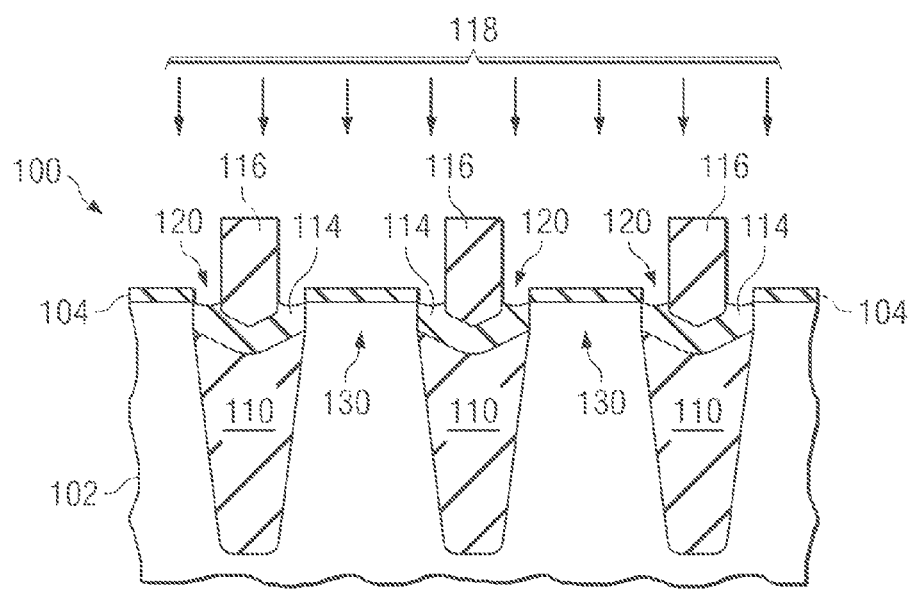

Referring next to FIG. 7, an etch process 118 is used to remove a portion of the stress-inducing material 114 from over the top surface and sidewalls of the pad nitride 106 and the pad oxide 104. The etch process 118 may also remove the pad nitride 106, as shown. The etch process 118 may also remove the bird-beak shaped corners (see FIG. 6) at the top of the second insulating material 116, resulting in columnar-shaped portions of the second insulating material 116 being left remaining over the stress-inducing material 114 within the trenches 108.

The etch process 118 may comprise a hot phosphoric etch process or $NF_3$, as examples, although other etch processes may also be used, depending on the type of material of the stress-inducing material 114, for example. The etch process 118 may comprise an etch process with etch selectivity to oxide, e.g., to the pad oxide 104 and the second insulating material 116. The etch process 118 may result in the formation of divots 120 in the top surface of edge regions of the stress-inducing material 114 proximate the top surface of the workpiece 102. The divots 120 may comprise a depth of a few nm, for example. If the trenches 108 comprise substantially rectangular shapes that extend in and out of the paper, the divots 120 may comprise shallow gutter-shaped depressions in the top surface of the isolation region 134 (not labeled in FIG. 7; see FIG. 9), for example. The stress-inducing material 114 is left remaining beneath the second insulating material 116 and proximate the top surface of the workpiece 102 within the trenches 108.

Figure 8:
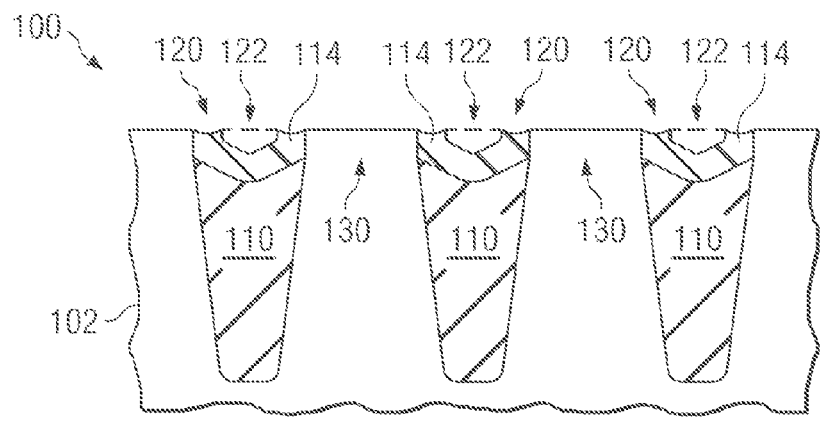

The second insulating material 116 is removed from over the stress-inducing material 114 using an etch process, leaving the structure shown in FIG. 8. The etch process used to remove the second insulating material 116 may also result in the removal of the pad oxide 104, as shown. The etch process may comprise an etch process with etch selectivity to the material of the stress-inducing material 114 and the workpiece 102, for example. The etch process used to remove the second insulating material 116 may comprise an HF etch-back process, as an example, although other etch processes may also be used.

A divot 122 may be formed proximate the central region of the stress-inducing material 114 in the trenches 108, as shown in FIG. 8, after the removal of the second insulating material 116. The divot 122 may be formed as a result of the shape of the stress-inducing material 114 that conforms to the top surface of the first insulating material 110, if the removal of the top portion of the first insulating material 110 results in a depressed central region of the first insulating material 110, (e.g., as shown in FIG. 4). Alternatively, a divot 122 may not be formed, as shown in phantom.

Figure 9:
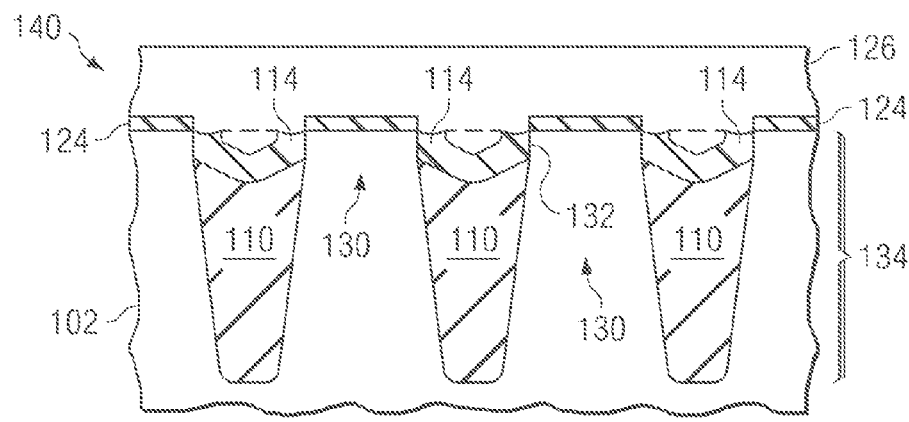

Thus, an isolation region 134 is formed that comprises the first insulating material 110 and the stress-inducing material 114, as shown in FIG. 9. Advantageously, the stress-inducing material 114 introduces stress in the top portion of the isolation region 134 adjacent the sidewalls of the workpiece 102.

Processing of the semiconductor device 100 is then continued. For example, if the semiconductor device 100 comprises a transistor 140 device, a gate oxide 124 may be grown or deposited over the workpiece 102. The pad oxide may be re-grown to remove the damaged pad oxide from the isolation trench 134 fill process, for example. The gate oxide 124 may be selectively grown only on the workpiece 102. The gate oxide 124 may comprise silicon dioxide or other dielectric materials, for example. A gate material 126 is deposited over the gate oxide 124 and the isolation regions 134. The gate material 126 may comprise polysilicon and may be silicided, for example, not shown, although alternatively, the gate material 126 may comprise other materials.

The gate material 126 and the gate oxide 124 are patterned, forming a transistor 140. A channel region 130 is formed beneath the gate oxide 124. The stress-inducing material 114 of the isolation region 134 introduces stress directly to the channel regions 130 because the stress-inducing material 114 is adjacent the channel regions 130 in the upper portion of the isolation regions 134, as shown at region 132.

A perspective view of the semiconductor device 100 of FIG. 9 is shown in FIG. 10. The view at 9-9 in FIG. 10 reflects the cross-sectional view shown in FIG. 9. The gates 126 have been patterned to extend lengthwise across the surface of the workpiece 102 and may extend farther than shown in FIG. 10. Stress 136 is created by the stress-inducing material 114, and the stress 136 is exerted on the channel regions 130 of the transistor 140. The direction of the arrows representing the stress 136 in FIG. 10 indicates a compressive stress 136 exerted on the channel regions 130, for example. Alternatively, a tensile stress 136 may also be introduced by the isolation regions 134, depending on the type of material of and methods of depositing and optionally, annealing, the stress-inducing material 114. Source and drain regions 128 may be formed proximate the channel regions 130 in the workpiece 102.

In some applications, it may be advantageous to increase the stress in one region, but not another region of the workpiece 102. For example, complementary metal oxide semiconductor (CMOS) devices typically comprise p-channel field effect transistors (PFETs) and n-channel field effect transistors (NFETs) arranged in complementary arrangements. It may be desirable to enhance the stress of the workpiece 102 in an isolation region 134 proximate a PFET in one region, but not enhance the stress of an isolation region 134 proximate an NFET in another region, in some applications. Thus, some regions of the workpiece 102 may include isolation regions 134 having the stress-inducing material 114 formed therein, whereas other isolation regions (not shown) may not include the stress-inducing material 114, for example.

One gate 126 may comprise a gate of a PFET device, and the other gate 126 may comprise a gate of an NFET device, e.g., in a CMOS device. The stress-inducing material 114 may be different for PFET and NFET devices. In some applications, PFET devices may benefit from compressive stress and NFET devices may benefit from tensile stress proximate the channel region 130. For example, one transistor 140 may comprise a PFET and the stress-inducing material 114 may comprise a material that induces a compressive stress. The other transistor 140 may comprise an NFET and the stress-inducing material 114 may comprise a material that induces a tensile stress. The stress-inducing material 114 may comprise a different material or may introduce a different amount or type of stress for various devices across the surface of the workpiece 102, for example.

In these embodiments, after the etch-back of the first insulating material 110, portions of the workpiece 102 may be masked with a masking material (not shown) such as a hard mask, before the stress-inducing material 114 is deposited. The masking material may be deposited over the entire workpiece 102, and the masking material may be patterned using a photoresist and lithography to remove portions of the masking material from over regions of the workpiece 102 where isolation regions 134 will be formed that include the stress-inducing material 114. The stress-inducing material 114 is then deposited. The hard mask may fill the top portion of the trenches in isolation regions that do not include the stress-inducing material 114, for example, and excess stress-inducing material 114 is removed from over these regions. Processing of the semiconductor device 100 is continued as described herein.

Alternatively, the stress-inducing material 114 may be formed over the entire workpiece 102, and portions of the stress-inducing material 114 may be removed from over the workpiece 102 using lithography, in regions where isolation regions will not include the stress-inducing material 114. The second insulating material 116 is then deposited, filling the top portion of the trenches 108 in isolation regions that do not include the stress-inducing material 114.

One type of stress-inducing material 114 may be formed in some regions of the workpiece 102, and another type of stress-inducing material 114, e.g., having a different type or amount of stress, may be formed in other regions of the workpiece 102, using the methods described in the previous two paragraphs, for example. Thus, two or more types of stress-inducing materials 114 may be included in the top portion of trenches 108 of isolation regions 134 across a surface of a workpiece 102 in accordance with an embodiment of the present invention, tailoring the material of the stress-inducing materials 114 to the type of devices proximate or adjacent the isolation regions 134.

FIGS. 11 and 12 show cross-sectional views of a semiconductor device 200 in accordance with another embodiment of the present invention, wherein a dry etch process is used to recess the first insulating material. Like numerals are used for the various elements that were used to describe FIGS. 1 through 10, and to avoid repetition, each reference number shown in FIGS. 11 and 12 is not described again in detail herein. Rather, similar materials x02, x04, x06, x08, etc. . . . are preferably used for the various material layers shown as were used to describe FIGS. 1 through 10, where x=1 in FIGS. 1 through 10 and x=2 in FIGS. 11 and 12.

Using a dry etch process to recess the first insulating material 210 below the top surface of the workpiece 202 may result in the recessed first insulating material 210 having a substantially flat top surface within the trenches 208, as shown in the cross-sectional view of FIG. 11. The etch process to recess the first insulating material 210 may comprise a dry etch process, e.g., comprising $NF_3$ or other etchant materials. The first insulating material 210 may comprise a depth or dimension $d_5$ of about 100 nm or less in the trenches 208 below the top surface of the workpiece 202, in some embodiments, for example. Alternatively, the first insulating material 210 may be recessed by other predetermined amounts, e.g., greater than about 100 nm in the trenches 108 below the top surface of the workpiece 102.

The stress-inducing material 214 may introduce less stress to the workpiece 202 adjacent the isolation region 234 in this embodiment, for example, than the previous embodiment described, because the stress-inducing material 214 is not thicker in the central region of the isolation region 234 (in contrast, a thicker central region of the stress-inducing material 114 is shown in phantom in FIG. 9). The fabrication process is then continued as described with respect to the first embodiment shown in FIGS. 1 through 10, forming a semiconductor device 200 comprising a transistor 240, wherein the isolation regions 234 include the first insulating material 210 and the stress-inducing material 214, as shown in FIG. 12.

In the embodiment shown in FIGS. 1 through 10, the shape of the stress-inducing material 114 may result in the introduction of more stress in the region of the workpiece 102 proximate the stress-inducing material 114. In the embodiment shown in FIGS. 11 and 12, wherein the stress-inducing material 214 comprises a flat top surface, less stress is introduced to the workpiece 102 proximate the stress-inducing material 214. Thus, an etch process for recessing the first insulating material 110 or 210 may be selected depending on the amount of stress desired, for example, wherein a dry etch process results in less stress and a wet etch process results in more stress being introduced to the adjacent workpiece 102 at regions 132 or 232.

Embodiments of the present invention include novel isolation regions 134, 234, and 334, stress-inducing structures, and methods of fabrication thereof. Embodiments of the present invention also include novel stress-inducing materials 114, 214, and 314.

Figure 13:
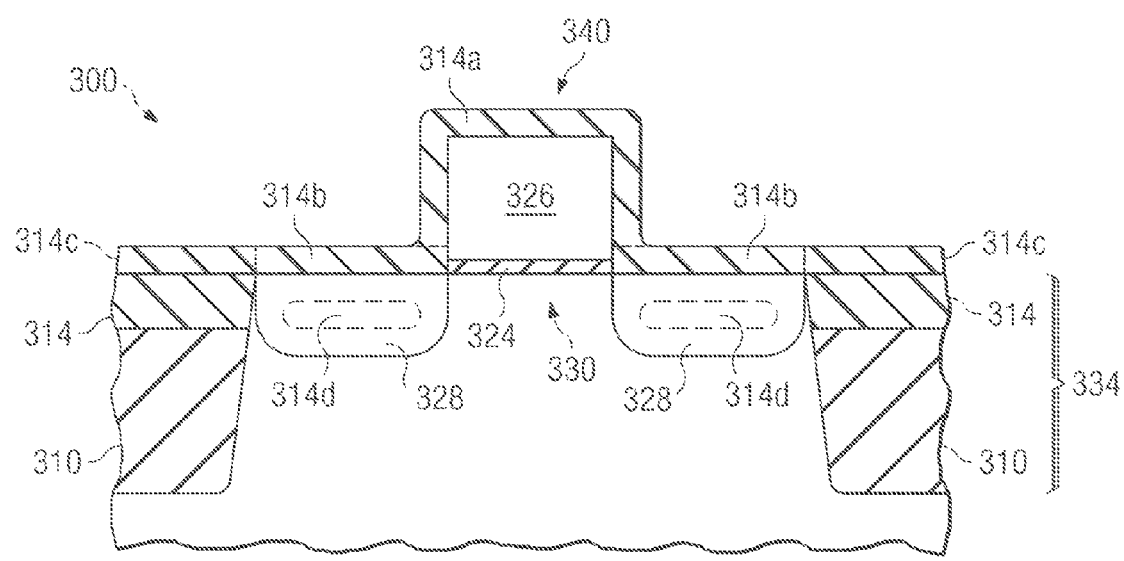
FIG. 13 shows a cross-sectional view of a semiconductor device in accordance with yet another embodiment of the present invention, wherein a novel stress-inducing material is disposed over portions of the semiconductor device.

For example, FIG. 13 shows a semiconductor device 300 in accordance with yet another embodiment of the present invention, wherein a novel stress-inducing material 314, 314a, 314b, 314c, or 314d is disposed over a portion of the semiconductor device 300. The stress-inducing material 314, 314a, 314b, 314c, or 314d comprises zirconium oxide (e.g., $ZrO_2$ or $Zr_2O_3$) and a stress-altering component. The stress-altering component may also function as a stabilizing component, for example.

The stress-altering component may comprise $Er_2O_3$, $Y_2O_3$, $Sm_2O_3$, $Tb_2O_3$, or other rare earth element containing materials. As one example, the stress-inducing material 314, 314a, 314b, 314c, or 314d may comprise $ZrO_2$ or $Zr_2O_3$ doped with $Er_2O_3$. The stress-altering component of the stress-inducing material 314, 314a, 314b, 314c, or 314d may alternatively comprise CaO or MgO, as examples. The stress-inducing material 314, 314a, 314b, 314c, or 314d may comprise CaO or MgO combined with $ZrO_2$ or $Zr_2O_3$, for example.

The stress-inducing material 314, 314a, 314b, 314c, or 314d may be placed on regions of a semiconductor device 300 that would benefit from an introduction of stress to the structure. A transistor device 340 is shown, e.g., in a view at 13-13 of FIG. 10. The stress-inducing material 314, 314a, 314b, 314c, or 314d may be disposed over or within a channel region 330, a source or drain region 328, a gate 326, an isolation region 334, or an active area of the semiconductor device 300.

For example, stress-inducing material 314 is shown disposed within a top portion of an isolation region 334, as described for the embodiments of the present invention shown in FIGS. 1 through 12. A stress-inducing material 314a may also or alternatively be formed over the top surface and/or sidewalls of a gate 326 and gate oxide 324. A stress-inducing material 314b may also or alternatively be formed over a source or drain region 328. A stress-inducing material 314c may also or alternatively be formed over an isolation region 334. A stress-inducing material 314d may also or alternatively be formed within a source or drain region 328, as shown in phantom in FIG. 13, e.g., comprising an island of the stress-inducing material 314d disposed below a top surface of the source or drain region 328. The novel stress-inducing materials 314, 314a, 314b, 314c, or 314d comprising $ZrO_2$ or $Zr_2O_3$ and CaO, MgO, $Er_2O_3$, $Y_2O_3$, $Sm_2O_3$, $Tb_2O_3$, or other rare earth element-containing materials may also be used to introduce stress to other active areas and types of semiconductor devices 300, for example.

Referring again to the embodiments shown in FIGS. 1 through 12, advantageously, the presence of the stress-inducing material 114 and 214 in the isolation regions 134 or 234 protects the isolation regions 134 or 234 from being over-etched during the patterning of the gate material 126 and 226. The etch process for the gate material 126 and 226 may comprise a highly selective etch process that is adapted to stop on the stress-inducing material 114 and 214, preventing a gate 126 and 226 over-etch proximate the sides of the isolation structures 134 and 234, reducing device 100 and 200 defects and improving yields.

The isolation regions 134, 234, and 334 described herein are shown as comprising STI regions formed between transistors and portions of transistor 140, 240, and 340 devices. Alternatively, the novel isolation regions 134, 234, and 334 described herein may be disposed proximate and may provide isolation for complementary metal oxide semiconductor (CMOS) devices, memory devices, logic devices, power devices, circuitry components, groups of circuitry components, or combinations thereof, as examples, not shown.

Devices and/or transistors 140, 240 or 340 in active regions of the workpiece 102, 202, and 302 may be formed before, or after, or partially before and partially after, the formation of the novel isolation regions 134, 234, and 334 and stress-inducing materials 114, 214, 314, 314a, 314b, 314c, and 314d described herein, for example.

Advantages of embodiments of the present invention include providing novel isolation region structures 134, 234, and 334 and methods of fabrication thereof, wherein the isolation regions 134, 234, and 334 provide isolation between adjacent action regions and devices such as transistors 140, 240, and 340, while also enhancing stress in the workpiece 102, 202, and 302, thus enhancing performance of the active regions and devices. For example, if the active regions comprise portions of transistors 140, 240, and 340, the on and off current ($I_{on}$ and $I_{off}$) of the transistors 140, 240, and 340 may be altered using the isolation regions 134, 234, and 334 comprising the stress-inducing materials 114, 214, and 314 described herein. The stress-inducing materials 114, 214, and 314 may increase the on current $I_{on}$ for a PFET device formed in the workpiece 102, 202, and 302 proximate the isolation regions 134, 234, and 334, as an example. Channel 130, 230, or 330 mobility of transistors 140, 240, and 340 formed adjacent the isolation regions 134, 234, and 334 is increased or improved by embodiments of the present invention. The stress-inducing material 114, 214, and 314 comprises a fill cap for the isolation regions 134, 234, and 334 that induces stress directly at (e.g., adjacent and abutting, at regions 132 and 232) a channel region 130, 230, or 330, for example.

If channel regions 130, 230, or 330 are formed in the workpiece 102, 202, and 302 adjacent the isolation regions 134, 234, and 334, stress may be applied directly on the channel region 130, 230, or 330 of a transistor 140, 240, and 340, for example, on the sidewalls of the channel regions 130, 230, or 330 at the junction of the channel region 130, 230, or 330 of the workpiece 102, 202, and 302 and the stress-inducing material 114, 214, and 314 at regions 132 and 232. A stress component, e.g., the stress-inducing material 114, 214, and 314, is introduced at the height of the channel region 130, 230, and 330, proximate the top portion of the trenches 108 and 208 of the isolation regions 134, 234, and 334 in the workpiece 102, 202, and 302. The stress increases the mobility of the channel region 130, 230, or 330 of the transistors 140, 240, and 340.

In other embodiments, not shown, the isolation regions 134, 234, and 334 may be formed adjacent source and drain regions of a transistor, and the stress-inducing material 114, 214, and 314 induces stress on the source and drain regions of the transistor 140, 240, and 340. The stressed source and drain regions then induce stress to an adjacent channel region 130, 230, or 330, for example.

The type of stress of the stress-inducing materials 114, 214, and 314 may be tailored for the stress needs of the active area of the semiconductor device 100, 200, and 300 proximate the isolation region 134, 234, and 334. Embodiments of the novel invention provide flexibility in adjusting the amount or type of stress to meet the needs of a particular device. The stress-inducing material 114, 214, and 314 may increase the tensile or compressive stress of the workpiece 102, 202, and 302 proximate the stress-inducing material 114, 214, and 314, for example.

In embodiments wherein the second insulating material 116 comprises HDP oxide, the present invention may result in improved CMP uniformity and reduced dishing, for example. The requirement of a divot refill may be achieved by embodiments of the present invention, because the material of the stress-inducing material 114, 214, and 314 is less prone to divot formation in subsequent manufacturing processes, in comparison to oxides often used in isolation structures.

Semiconductor devices 100, 200, and 300 may be manufactured wherein some isolation regions 134, 234, and 334 include the stress-inducing material 114, 214, and 314 and other isolation regions do not include the stress-inducing material 114, 214, and 314, so that stress is increased for some transistor channel regions 130, 230, or 330 of a semiconductor device 100, 200, and 300 but the stress is not increased for other transistors. Two or more different types of stress-inducing materials 114, 214, and 314 may also be used, wherein one stress-inducing material 114, 214, and 314 causes compressive or tensile stress in the workpiece 102, 202, and 302 in some regions of the workpiece 102, 202, and 302, and wherein another stress-inducing material 114, 214, and 314 causes tensile or compressive stress in other regions of the workpiece 102, 202, and 302, for example. Alternatively, the stress-inducing materials 114, 214, and 314 may induce the same type of stress, e.g., compressive or tensile stress, in the workpiece in differing amounts from region to region of the workpiece 102, 202, and 302, due to a different thickness, material type, deposition process, or anneal process of the stress-inducing materials 114, 214, and 314 from one region to the next, for example.

The isolation regions 134, 234, and 334 may comprise shallow trench isolation (STI) regions, deep trench (DT) isolation regions, or a combination of both STI regions and DT isolation regions. For example, the isolation regions 134, 234, and 334 may comprise STI regions that comprise a depth of a few hundred nm within a workpiece 102, 202, and 302, or the isolation regions 134, 234, and 334 may comprise DT isolation regions that extend beneath a top surface of the workpiece 102, 202, and 302 by about 1,000 nm or more. Alternatively, the isolation regions 134, 234, and 334 may comprise an STI region proximate a top surface of the workpiece 102, 202, and 302 and may include a DT isolation region disposed beneath the STI region, as an example (not shown).

The formation of fill voids is avoided by embodiments of the present invention, because the novel stress-inducing material 114, 214, and 314 is applied between upper and lower fill portions, e.g., over the first insulating material 110 and 210 and beneath the second insulating material 116. The stress-inducing material 114, 214, and 314 functions as a protective barrier film between the first insulating material 110, 210 and 310 and the second insulating material 116 during the isolation region 134, 234, and 334 fabrication process, for example.

The stress-inducing material 114, 214, and 314 may comprise a material that prevents overetching during an etch process used to pattern a gate material 126, 226, and 336 to form gate contacts. Overetching along the sidewalls of diffusion areas may be eliminated, by the presence of the stress-inducing material 114, 214, and 314 at the top of the isolation regions 134, 234, and 334, by improving selectivity to a reactive ion etch process used to form the gates 126, 226, and 336 for example.

In embodiments wherein the first insulating material 110 comprises a V-shape, as shown in FIGS. 1 through 9, the tapered V-shape cross-section of the first insulating material 110 is easier to fill with the stress-inducing material 114.

Advantageously, the novel stress-inducing material 114, 214, and 314 of the isolation regions 134, 234, and 334 are formed relatively early in the manufacturing process flow for transistors 140, 240, and 340, e.g., before the deposition of the gate 126, 226, and 336 material, so that higher temperatures may be used for the various deposition and anneal processes described herein of the stress-inducing material 114, 214, and 314, achieving a higher stress on the channel regions 130, 230, or 330.

Other embodiments of the present invention provide novel stress-inducing materials 114, 214, 314, 314a, 314b, 314c, and 314d comprising $ZrO_2$ or $Zr_2O_3$ and a stress-altering material or component. The stress-inducing materials 114, 214, 314, 314a, 314b, 314c, and 314d may comprise $ZrO_2$ or $Zr_2O_3$ doped with $Er_2O_3$ or combined with CaO, MgO, $Y_2O_3$, or other rare earth element containing materials, as described herein, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An isolation structure comprising:
a trench disposed in a workpiece;
a first insulating material disposed in a lower portion of the trench;
a stress-inducing material disposed over the first insulating material; and
a divot comprising a gutter-shaped depression disposed in the stress-inducing material.

2. The isolation structure according to claim 1, wherein the first insulating material comprises a top surface, wherein the stress-inducing material is thicker at a central region of the top surface than at edge regions of the top surface.

3. The isolation structure according to claim 1, wherein the first insulating material comprises silicon dioxide or a tetra ethyl oxysilane (TEOS)-based oxide.

4. The isolation structure according to claim 1, wherein the stress-inducing material comprises $Si_3N_4$ or Bis-tertiarybutylamino-silane (BTBAS)-based silicon nitride.

5. The isolation structure according to claim 1, wherein the stress-inducing material comprises $ZrO_2$ or $Zr_2O_3$.

6. The isolation structure according to claim 5, wherein the stress-inducing material further comprises CaO, MgO, $Er_2O_3$, $Y_2O_3$, $Sm_2O_3$, $Tb_2O_3$, or another rare earth element-containing material.

7. The isolation structure according to claim 5, wherein the stress-inducing material further comprise a stress-altering component, and wherein the stress-altering component comprises about 5% or less of the stress-inducing material.

8. The isolation structure according to claim 5, wherein the stress-inducing material further comprise a stress-altering component, and wherein the stress-altering component comprises about 1% to about 2% of the stress-inducing material.

9. The isolation structure according to claim 1, wherein the stress-inducing material comprises $TiO_2$ or $Al_2O_3$.

10. The isolation structure according to claim 1, wherein the first insulating material comprises a substantially flat top surface.

11. The isolation structure according to claim 1, wherein the first insulating material comprises a top surface wherein a central region of the top surface comprises a lower height than edge regions of the top surface.

12. The isolation structure according to claim 1, further comprising a liner disposed between the workpiece and the first insulating material.

13. An isolation structure comprising:
a trench in a substrate;
an insulating material disposed in a majority of the trench;
at a top surface of the insulating material, a first gutter shaped depression disposed in the insulating material;
a stress-inducing material disposed directly on the insulating material and filling the first gutter shaped depression; and
at a top surface of the stress-inducing material, a second gutter shaped depression disposed in the stress-inducing material.

14. The isolation structure according to claim 13, further comprising a liner between the substrate and the insulating material.

15. The isolation structure according to claim 13, wherein the stress-inducing material is thicker at a central region of the top surface than at edge regions of the top surface.

16. The isolation structure according to claim 13, wherein the insulating material comprises oxide, and wherein the stress-inducing material comprises silicon nitride.

17. A transistor comprising:
a gate dielectric layer disposed on a substrate;
a first source/drain disposed in the substrate;
a second source/drain disposed in the substrate;
a gate disposed on the gate dielectric layer between the first source/drain and the second source/drain;
a trench disposed in the substrate;
a first insulating material disposed in a lower portion of the trench;
a stress-inducing material disposed over the first insulating material, wherein the first insulating material comprises a top surface, and wherein the stress-inducing material is thicker at a central region of the top surface than at edge regions of the top surface; and
a divot disposed in the stress-inducing material.

18. The transistor of claim 17, wherein the trench intersects the gate along one or more sides of the transistor at an intersection, and wherein the divot comprises a portion underlying the gate and filled with gate material at the intersection.

19. The transistor of claim 17, further comprising a depression disposed in the first insulating material and filled with the stress-inducing material.

20. The transistor of claim 17, wherein the first insulating material comprises oxide, and wherein the stress-inducing material comprises silicon nitride.

* * * * *